United States Patent
Moslehi et al.

[19]

[11] Patent Number: 6,073,576
[45] Date of Patent: Jun. 13, 2000

[54] SUBSTRATE EDGE SEAL AND CLAMP FOR LOW-PRESSURE PROCESSING EQUIPMENT

[75] Inventors: Mehrdad M. Moslehi, Los Altos, Calif.; Cecil J. Davis, Greenville, Tex.

[73] Assignee: CVC Products, Inc., Rochester, N.Y.

[21] Appl. No.: 08/977,822

[22] Filed: Nov. 25, 1997

[51] Int. Cl.⁷ .................................................. C23C 16/00
[52] U.S. Cl. ...................... 118/723 E; 156/345; 156/285; 118/728; 118/52; 438/618
[58] Field of Search ................ 216/71; 118/52, 118/726, 728; 361/233, 234; 156/288, 345, 285; 438/618

[56] References Cited

U.S. PATENT DOCUMENTS

| | | | |
|---|---|---|---|
| 4,194,233 | 3/1980 | Jones et al. | 361/233 |
| 4,603,466 | 8/1986 | Morley | 29/569 |
| 4,615,755 | 10/1986 | Tracy et al. | 156/345 |
| 5,096,536 | 3/1992 | Cathey, Jr. | 156/643 |
| 5,103,367 | 4/1992 | Horowitz et al. | 361/234 |
| 5,180,000 | 1/1993 | Wagner et al. | 165/80.1 |
| 5,213,650 | 5/1993 | Wang et al. | 156/345 |
| 5,267,607 | 12/1993 | Wada | 165/80.1 |
| 5,300,175 | 4/1994 | Gardener et al. | 156/285 |
| 5,325,261 | 6/1994 | Horowitz | 361/234 |
| 5,326,725 | 7/1994 | Sherstinsky et al. . | |
| 5,343,012 | 8/1994 | Hardy et al. | 219/443 |
| 5,382,311 | 1/1995 | Ishikawa et al. | 156/345 |
| 5,383,971 | 1/1995 | Selbrede . | |
| 5,660,699 | 8/1997 | Saito et al. | 204/297 |
| 5,730,804 | 3/1998 | Gomi et al. | 118/726 |
| 5,738,751 | 4/1998 | Camerson | 156/345 |
| 5,739,067 | 4/1998 | DeBusk et al. | 438/618 |
| 5,775,416 | 7/1998 | Heimanson et al. | 165/275 |
| 5,804,089 | 9/1998 | Suzuki et al. | 216/71 |
| 5,805,408 | 9/1998 | Maraschin et al. | 361/234 |
| 5,861,061 | 1/1999 | Hayes et al. | 118/52 |
| 5,936,829 | 8/1999 | Moslehi | 361/234 |

*Primary Examiner*—Thi Dang
*Assistant Examiner*—Rudy Zervigon
*Attorney, Agent, or Firm*—Eugene Stephens & Associates

[57] ABSTRACT

A low-pressure processor for processing substrates includes a chuck that engages the substrates' peripheries for purposes of clamping, sealing, and centering the substrates on chuck bodies. For accomplishing all three purposes, a mechanical clamp can be arranged with two sealing regions. One of the sealing regions seals the clamp to a chuck body or an extension of the chuck body, and another of the sealing regions engages a peripheral edge surface of a substrate for sealing the clamp to the substrate. The second sealing region includes an inclined seating surface that engages a front edge of the substrate's peripheral edge surface and divides a clamping force into a first component that presses the substrate against the chuck body and a second component that centers the substrate on the chuck body. The peripheral engagement of the substrate exposes substantially the entire front surface of the substrate to processing and exposes substantially the entire back surface of the substrate to a heat-transfer gas for enhancing thermal transfers between the substrate and the temperature-regulated chuck body.

70 Claims, 12 Drawing Sheets

SUBSTRATE EDGE SEAL AND CLAMP FOR LOW-PRESSURE PROCESSING EQUIPMENT

TECHNICAL FIELD

Substrates, such those used for fabricating semiconductor, data storage, flat-panel display, and optoelectronic devices, are supported for processing in vacuum (i.e., low-pressure) chambers on chucks that typically include clamps for securing the substrates. Some substrate processing operations such as physical and chemical vapor deposition processes benefit from controlled thermal transfers between the chucks and the substrates. A gas sealed between the chucks and substrates is often used as a conductive medium for enhancing the thermal transfers and for regulating the substrate temperature during both active heating and cooling operations.

BACKGROUND

Low-pressure processing operations including device fabrication processes take place in vacuum (low-pressure) chambers that include chucks for supporting substrates in near vacuum or other low-pressure environments. Typical operating pressures for low-pressure fabrication processes such as physical-vapor deposition (PVD) and chemical-vapor deposition (CVD) range from less than 0.1 mTorr to more than 10.0 Torr. Some substrate chucks merely provide a substrate support platform and rely on substrate weight to hold the substrates in place. Most chucks, however, actively secure the substrates in process positions with either mechanical or electrostatic clamps.

Some chucks are also involved with the processing of the substrates by producing electrical or magnetic fields and/or by regulating heat transfers to or from the substrates. Electrical fields (e.g., produced through radio-frequency or "RF" bias) can be used to generate or enhance a plasma as well as to direct plasma ions and control the energy of ions impinging on the substrate. Magnetic fields can also be used to influence the plasma or to magnetically orient magnetic films during plasma-assisted depositions or thermal annealing. Heat transfers can be used either to remove excess heat from the substrates produced during processing operations or to provide a controlled amount of substrate heating for assisting other processing operations. Some processing operations are best performed at fixed substrate temperatures or at substrate temperatures that are adjusted throughout different stages of the operations. During operations like thermal annealing and thermal chemical vapor deposition (CVD) processes, elevated substrate temperatures activate or actually accomplish the substrate processing.

Thermal deposition and thermally activated processes such as chemical-vapor deposition (CVD), metal-organic chemical-vapor deposition (MOCVD), and thermal annealing processes also require active substrate heating (e.g., up to 350° C.). Even higher substrate temperatures (e.g., up to 450° C.) may be required for physical-vapor deposition (PVD) reflow depositions of interconnect materials (e.g., Al or Cu) for void-free filling of high-aspect-ratio structures. While some plasma sputtering operations require active heating of substrates, other plasma sputtering operations may require active cooling of the substrates. Some thermal deposition processes such as MOCVD of high-dielectric constant BST materials may require chucks for active heating of substrates to temperatures as high as 650° C. On the other hand, some fabrication processes such as some plasma etch processes require active substrate cooling to temperatures as low as −40° C.

However, controlling substrate temperatures in near vacuum or other low-pressure environments (e.g., process pressures below 1.0 Torr) is quite difficult because heat does not transfer well between objects in such environments. For example, the conduction of heat between contiguous surfaces of a chuck body and the substrate in a low-pressure environment is slow and inefficient (resulting in large temperature offsets) because actual contact on an atomic scale between their surfaces is limited to a small fraction of their common areas, and gaps that separate the remaining common areas of their surfaces are sufficient to prevent effective heat transfer by thermal conduction.

Heating and cooling of substrates through radiational heat transfers are possible in low-pressure environments, particularly at elevated substrate and/or chuck temperatures; but radiational heat transfers are generally too slow at lower temperatures to maintain substrates at desired processing temperatures. Below 500° C., which includes most chuck-based fabrication processes, radiational heat transfers are generally too inefficient to regulate substrate processing temperatures effectively and quickly.

Faster transfers are possible by introducing a gas, preferably an inert gas such as helium or argon or another suitable gas such as nitrogen or hydrogen, between the chuck body and the substrate. Although still at much less than atmospheric pressure (e.g., 1 Torr to 20 Torr), the gas (referred to as a "heat-transfer" or "backside" gas) sufficiently fills the small gaps and voids between the chuck body and the substrate to support significant heat transfer by thermal conduction between them. A seal formed between the mounting surface of the chuck body and a back surface of the substrate resists leakage of the gas into the rest of the processing chamber, which could disturb substrate processing operations.

U.S. Pat. No. 4,680,061 to Lamont, Jr. and U.S. Pat. No. 4,949,783 to Lakios et al. disclose examples of chucks that promote such heat transfers between chuck bodies and substrates using a heat-transfer gas. Lamont, Jr. traps the gas in a shallow cavity between a chuck body and a substrate using a raised rim seal that projects from a mounting surface of the chuck body into engagement with a back surface of the substrate. Lakios et al. disclose a similar sealing structure but provide for circulating the gas through the cavity for removing excess heat from the substrate by both thermal conduction and forced thermal convection.

Although the raised rim seals of Lamont, Jr. and Lakios et al. circumscribe large interior portions of their substrates' back surfaces, the remaining portions of the back surfaces, which are engaged by their raised rim seals or which lie beyond the seals, are not exposed to the heat-transfer gas in the same manner as the more interior portions of the back surfaces. This can result in temperature gradients approaching their substrates' peripheries and in processing nonuniformities of corresponding peripheral regions on their substrates' front surfaces. Also, mechanical clamps of Lamont, Jr. and Lakios et al. engage the peripheral portions of their substrates' front surfaces, effectively blocking the engaged portions from effective processing due to an exclusion zone.

Accordingly, the usual practice has been to define a peripheral exclusion zone on the front surfaces of substrates, which must subsequently be discarded as unusable for device fabrication. Considering the high cost of substrate manufacture, considerable savings can be realized by reducing or eliminating the exclusion zone and fabricating active devices over the entire front surfaces of substrates.

SUMMARY OF INVENTION

This invention utilizes peripheral edge surfaces of substrates, which are located between the front and back surfaces of substrates, for alternative or combined purposes of sealing and clamping the substrates to chuck bodies within low-pressure processing chambers. Peripheral edge seals can be arranged as either (a) primary seals to prevent significant leakage of heat-transfer gas into a surrounding processing region of the processing chambers while exposing substantially the entire back surfaces of substrates to the gas at a higher pressure than the process pressure of the surrounding region or (b) secondary seals in conjunction with separate primary seals to further reduce such leakage. Peripheral edge clamps, which can also function as the peripheral edge seals, can be arranged to engage front edges of the substrates' peripheral edge surfaces for both (a) clamping the substrates against the chuck bodies and (b) centering the substrates on the chuck bodies while exposing substantially the entire front surfaces of the substrates to processing for extended front surface process coverage.

One embodiment of the invention envisioned as a low-pressure processing chuck includes a chuck body for supporting a substrate within an evacuatable space of a low-pressure processing chamber. The substrate has a front surface, a back surface, and a peripheral edge surface interconnecting the front and back surfaces. A sealing structure engages the peripheral edge surface of the substrate and together with the substrate and the chuck body forms a separately pressurizable region within the evacuatable space of the low-pressure processing chamber.

Preferably, the chuck body includes a mounting surface that together with the back surface of the substrate forms a heat-transfer interface, which itself comprises a first part of the separately pressurizable region. A second part of the separately pressurizable region surrounds the first part of the separately pressurizable region and isolates the first part of the separately pressurizable region from a processing region of the low-pressure processing chamber.

A control system can be used to direct a free (or essentially uninhibited) flow of heat-transfer gas between the two parts of the separately pressurizable region for exposing substantially the entire back surface of the substrate to the pressurized heat-transfer gas. Alternatively, the two parts of the separately pressurizable region can be separated by a seal, and the control system can be arranged to separately regulate pressures (or flows) in the two parts. For example, pressures in the second part of the separately pressurizable space can be reduced with respect to pressures in the first part of the separately pressurizable space for minimizing leakage of the heat-transfer gas from the first part of the separately pressurizable space into the processing region of the low-pressure processing chamber.

Envisioned specifically as a sealing structure, the invention provides at least part of a connection between the substrate and the chuck body for forming the separately pressurizable region within the low-pressure processing chamber. The sealing structure has a seal body with two sealing regions. The first sealing region contributes a portion of a first seal for connecting the seal body at least indirectly to the chuck body or an extension of the chuck body, and the second sealing region contributes a portion of a second seal that engages the peripheral edge surface of the substrate for connecting the seal body to the substrate.

Preferably, the second sealing region forms a full peripheral seat that engages the entire periphery of the substrate's peripheral edge surface. The full peripheral seat preferably conforms to the shape of the substrate's peripheral edge surface (e.g., circular or square for circular or square substrates) including reference features formed in the surface (e.g., flats or notches). Extended finger portions could also be used to cover localized reference features such as notches. The seat is also preferably shaped to expose substantially the entire front surface of the substrate for processing within the low-pressure processing chamber for the purpose of full-face coverage or near full-face coverage processing. However, the seat can also be shaped to prevent unwanted deposition of processing material at the second seal (for instance, to prevent sticking of the second seal to the substrate in a PVD process).

In addition to functioning as a seal, the sealing structure can also perform centering and clamping functions. For example, the second sealing region can also be shaped (e.g., as a truncated cone or pyramid) for centering the substrate on the chuck body in response to relative movement between the seal body and the chuck body along a centerline of the chuck body. An inclined surface of the second sealing region engages the peripheral edge surface of the substrate for guiding the substrate into a desired position on the chuck body.

The peripheral edge surface of the substrate includes a front edge adjacent to the front surface of the substrate and a back edge adjacent to the back surface of the substrate. The inclined surface of the second sealing region can engage either the front edge or the back edge of the peripheral edge surface for completing the second seal. When the front edge is engaged, the sealing structure can also function as a clamp for pressing the substrate against the chuck body. However, when the back edge is engaged, a separate clamping device, such as a mechanical or electrostatic clamp, is preferably used to secure the substrate to the chuck body (particularly when active heating or cooling of the substrate is required).

The invention can be arranged to perform the clamping function either independent of or in conjunction with the sealing function. Envisioned as a clamp, the invention includes a clamp body that is relatively translatable with respect to the chuck body along a central axis or centerline of the chuck body. An inner engaging region has an inclined seating surface that contacts the front edge of the peripheral edge surface for guiding the substrate into a desired position on the chuck body in response to the relative movement between the clamp and chuck bodies along the chuck body centerline.

The inner engaging region is preferably shaped to expose substantially the entire front surface of the substrate for full-face coverage or near full-face coverage processing within the low-pressure processing chamber. However, the inner engaging region can also be arranged to overhang a portion of the front surface of the substrate to prevent unwanted deposition of processing material at an interface between the inclined seating surface and the front edge of the substrate (for instance, to prevent sticking of the clamp to the substrate in a PVD process).

In the absence of the substrate, the inclined seating surface can be arranged to engage a mating surface on the chuck body for centering the clamp body on the chuck body for improved wafer-handling reliability. Any mismatch between the surfaces of the clamp and the chuck body can be corrected in advance of processing to assure that the substrates are appropriately centered on the chuck body in order to eliminate the possibility of substrate misprocessing or robotic handling failures.

The inclined seating surface of the clamp can be a discontinuous surface for purposes of clamping but is preferably arranged as a full peripheral seal for also performing a sealing function. The clamp body is also preferably arranged to form another full peripheral seal with the chuck body to isolate a separately pressurizable region within the low-pressure processing chamber.

DRAWINGS

DETAILED DESCRIPTION

Figure 1:
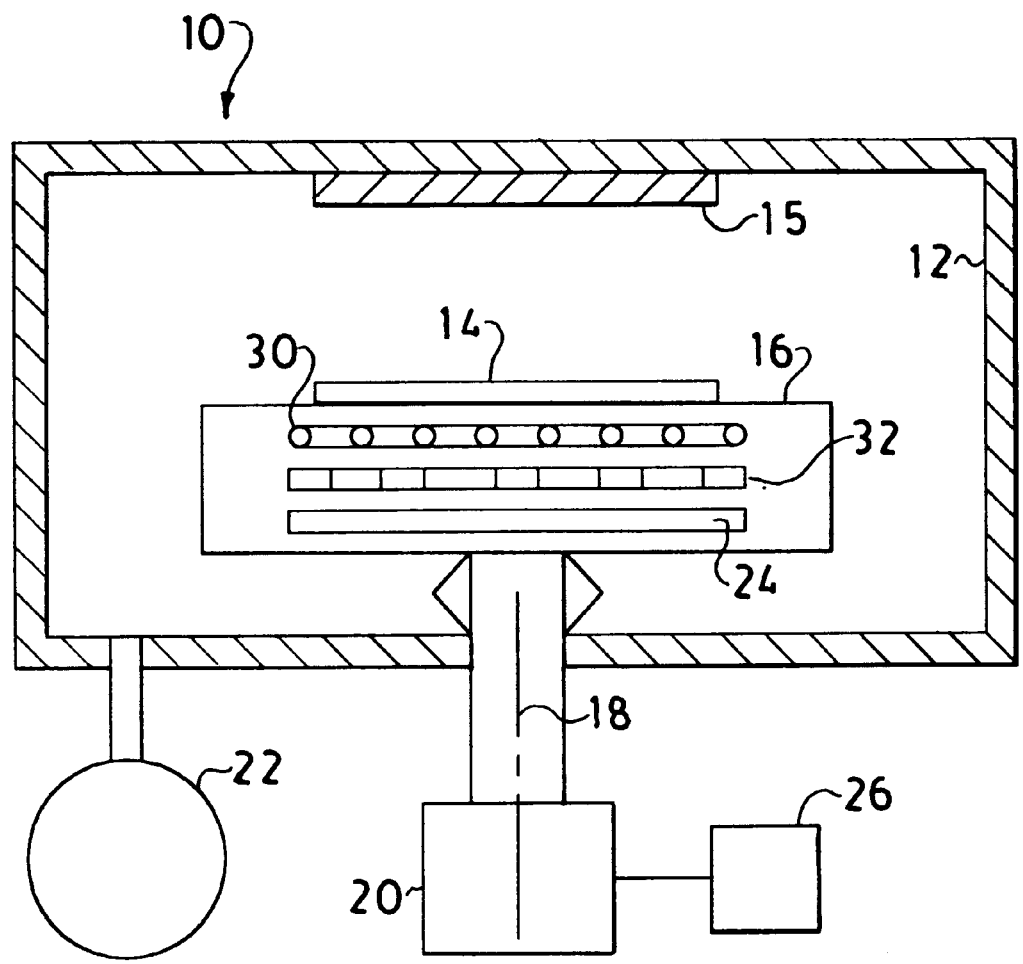
FIG. 1 is a schematic cross-sectional view of a low-pressure processor in which a substrate is mounted on a processing chuck that is adjustable in height within a processing chamber.

An exemplary low-pressure processor 10, which is depicted schematically in FIG. 1, includes a low-pressure processing chamber 12 for processing a substrate 14, such as a silicon or gallium arsenide wafer or another type of substrate (e.g., glass or ceramic substrates) used for fabricating such devices as flat panel displays, data storage heads or media, and solar cells. A chuck 16 supports the substrate 14 within the low-pressure processing chamber 12 in adjustable-height positions that can be varied along a reference axis 18. A drive mechanism 20 moves the chuck 16 together with the substrate 14 along the reference axis 18 for positioning the substrate 14 within the processing chamber 12.

A vacuum pump 22 evacuates the processing chamber 12 for supporting operations that are best performed in a near vacuum or other low-pressure environment. For instance, the low-pressure processor 10 is intended for operations such as physical vapor deposition (PVD), including ion-beam deposition and plasma-assisted sputtering, chemical vapor deposition (CVD), metal-organic chemical vapor deposition (MOCVD), and plasma-enhanced chemical vapor deposition (PECVD)—all of which deposit material layers on the substrate 14. A processing head 15, for example, can function as a gas showerhead for CVD or MOCVD or as a target plate for PVD operations. Other exemplary treatment operations affecting the substrate or the deposited materials include thermal planarization, annealing, plasma etching, plasma annealing, and substrate cleaning.

Various electrical and magnetic fields can be used for initiating or controlling the substrate processing operations. In the vicinity of the substrate 14, a magnetic field can be used for orienting magnetic materials (e.g., soft and hard magnetic layers) that are deposited on the substrate (e.g., magnetic data storage thin-film head substrate), and an electrical bias (DC or RF) can be used for enhancing or otherwise regulating the impact of ions on the substrate 14. Polarities of the various electrical or magnetic fields can also be varied to further influence operations. For example, the chuck 16 contains a plate-shaped electromagnet 24 for supporting substrate processing operations requiring a magnetic field in the vicinity of the substrate 14 for in-situ magnetic orientation and is also connected to an RF or AC generator 26 for supporting processing operations requiring an electrical bias.

Also within the chuck 16 are two temperature regulators, namely, a heating element 30 and a cooling element 32. The heating element 30 enables operations requiring controlled substrate heating at elevated substrate temperatures, and the cooling element 32 supports operations requiring withdrawal of excess heat from the substrate 14 or the chuck 16. Together, the heating and cooling elements 30 and 32 can optimize substrate temperatures and facilitate precise substrate temperature control throughout various stages of processing that are best performed at particular temperatures or rates of temperature change. Further details of a chuck containing both heating and cooling elements are disclosed in co-assigned U.S. application Ser. No. 08/560,344, entitled "Temperature Controlled Chuck for Vacuum Processing", filed Nov. 17, 1995. This application is hereby incorporated by reference.

The subject invention, which relates to sealing, clamping, and centering substrates on chucks, can be practiced with different combinations of temperature-regulating components for supporting particular processing operations. For example, only the heating element 30 or only the cooling element 32 could be incorporated into the chuck 16 to support operations requiring either heating or cooling, or the chuck 16 itself could be used as a heat sink independent of any other temperature regulator. For purposes of clamping alone, substrate temperature regulation is optional and can be used depending on the specific process requirements.

Figure 2:
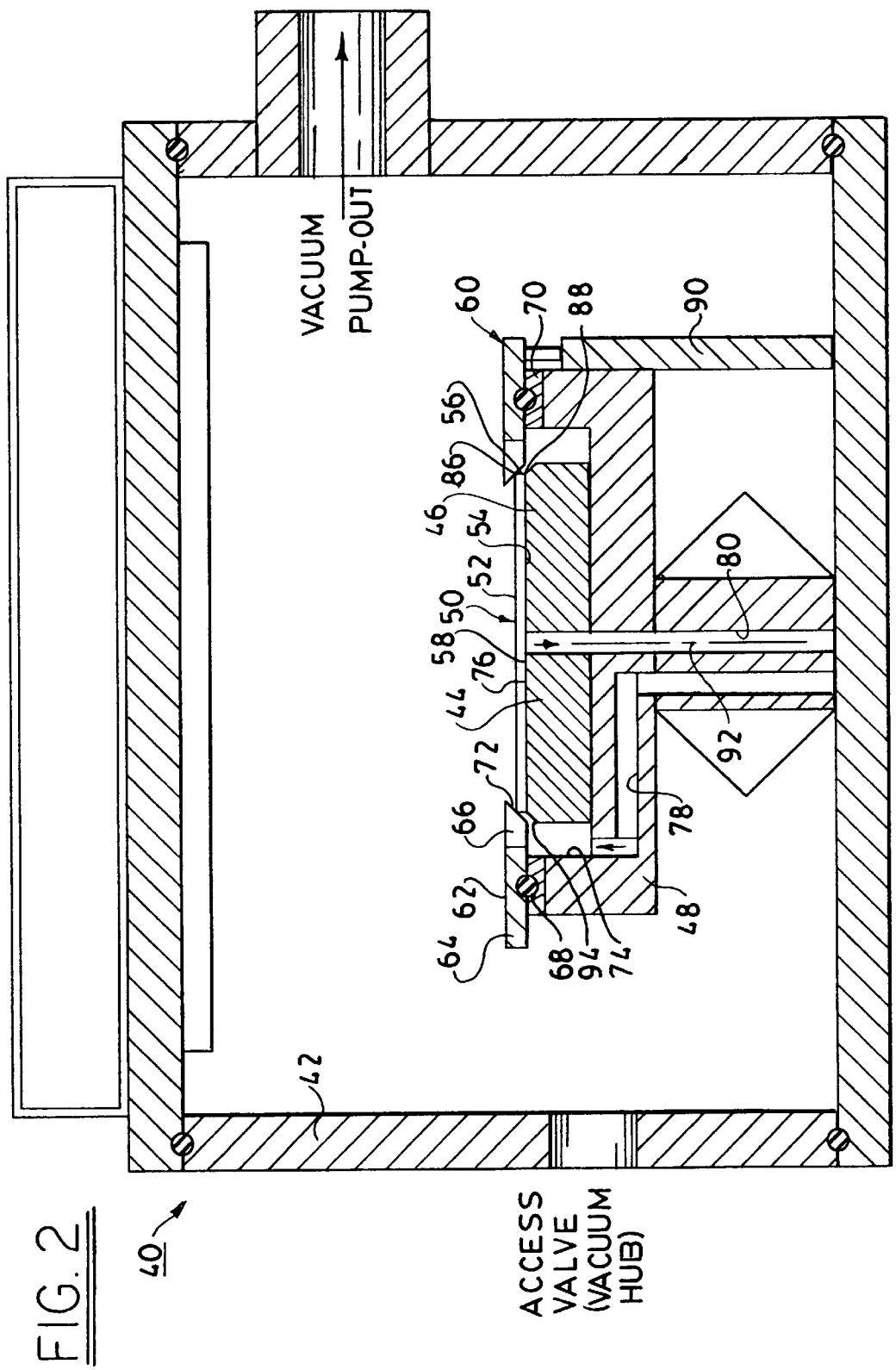
FIG. 2 is a schematic cross-sectional view of a low-pressure processor showing an inclined seating surface of a chuck body engaging a front edge of a substrate for clamping, sealing, and centering the substrate on the chuck body.

A low-pressure processor 40, which is depicted in FIG. 2, provides an example of the improved clamping, sealing, and centering capabilities of the invention. A low-pressure chamber 42 provides an evacuatable space for carrying out processing operations such as physical vapor deposition (PVD) at reduced operating pressures. A chuck body 44, which is translatable within the low-pressure chamber 42, includes a temperature-regulated pedestal 46 supported within a chuck housing 48.

A substrate 50, having a front surface 52, a back surface 54, and a peripheral edge surface 56 interconnecting the front and back surfaces 52 and 54, is supported on a mounting surface 58 of the temperature-regulated pedestal 46. A clamp 60, including a clamp body 62 and two sealing regions 64 and 66, secures the substrate 50 to the chuck body 44. An oversized elastomeric O-ring 68 mounted on support ring 70 of the chuck housing 48 engages the first sealing region 64 for sealing the clamp body 62 to the chuck body 44. An inclined seating surface 72 of the second sealing region 66 seals the clamp body 62 to the peripheral edge surface 56 of the substrate 50.

The clamp body 62 together with the chuck body 44 and the substrate 50 bounds a separately pressurizable region 74 within the evacuatable space of the low-pressure chamber 42. The separately pressurizable region 74 both incorporates and surrounds a heat-transfer interface 76 between the back surface 54 of the substrate 50 and the mounting surface 58 of the chuck body 44. An inlet conduit 78 directs a flow of heat-transfer gas (such as argon, helium, nitrogen, or hydrogen) to the separately pressurizable region 74 beyond a periphery of the heat-transfer interface 76, and an outlet conduit 80 directs the flow of heat-transfer fluid from the center of the heat-transfer interface 76.

Figure 3:
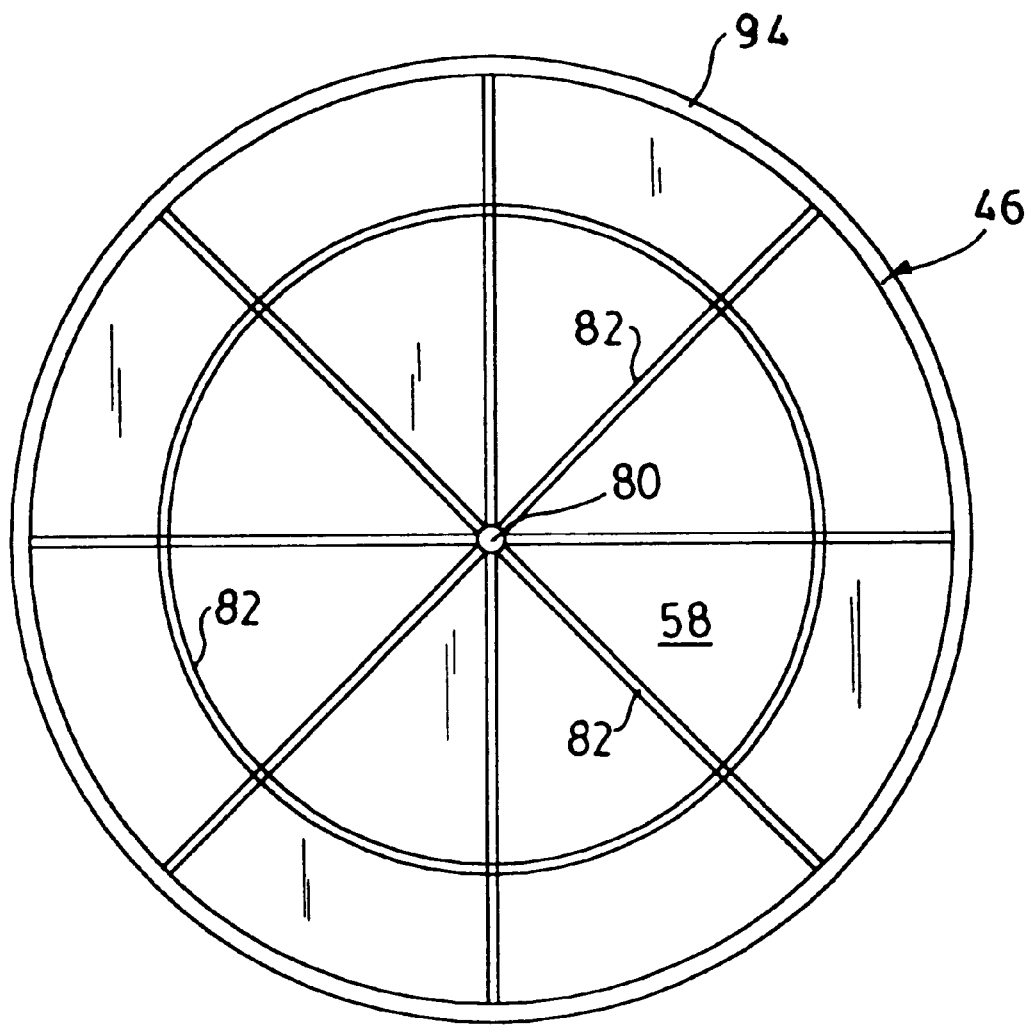
FIG. 3 is a plan view of a mounting surface of the chuck of FIG. 2 showing channels that enable free flows of gas throughout a substrate-chuck interface.

The plan view of FIG. 3 depicts channels 82 formed in the mounting surface 58 for circulating (flowing) the heat-transfer gas throughout and beyond the heat-transfer interface 76. In place of the channels, a slotted rim or support posts projecting from the mounting surface 58 could be used to provide space for similarly circulating (or flowing) the heat-transfer gas. Substantially the entire back surface 54 is exposed to the heat-transfer gas for promoting more uniform and efficient heating or cooling of the substrate 50. A flow control system (not shown) regulates gas pressures and flow rates through the heat-transfer interface 76 for achieving the desired heat transfers between the temperature-regulated pedestal 46 of the chuck body 44 and the substrate 50. Typically, the heat-transfer gas pressure can be set within a range from at least 1.0 Torr to over 20.0 Torr.

A temperature regulator is also not shown in the drawing FIGS. 2 or 3. However, a heating element, a cooling element, or both heating and cooling elements can be incorporated into the temperature-regulated pedestal 46 for regulating the temperature of the substrate 50. The clamp 60, which also functions as a gas sealing structure, can be either thermally coupled to or thermally isolated from the chuck body 44. Sealing is generally more difficult at elevated chuck and substrate temperatures—so the clamp 60 is preferably thermally isolated or at least partially thermally isolated from the temperature-regulated pedestal 46 for most heating operations. In order to minimize the heat-sinking effect of the clamp 60, at least the sealing region 66 of the clamp body 62 is preferably made from a thermal insulating or low-thermal-conductivity material, such as a ceramic (aluminum oxide), polymer (TEFLON) or plastic material, or another low-thermal-conductivity material.

The heat-transfer gas, which is preferably an inert gas (such as argon, helium, or xenon) or another suitable gas (such as nitrogen or hydrogen), is preferably flowed continuously through the heat-transfer interface 76 so that flow rate variations and pump-out conductance changes can be used to make rapid changes or adjustments in gas pressure throughout the heat-transfer interface 76 and the surrounding portion of the separately pressurizable region 74. Although the gas pressures within the separately pressurizable region 74 are usually higher than those in the remaining evacuatable space of the processing chamber 42, these pressures are preferably kept to a minimum required (e.g., between 1 Torr and 10 Torr) to support the desired heat transfers between the temperature-regulated pedestal 46 and the substrate 50 while avoiding excess gas leakage, such as more than 10 sccm, through the two sealing regions 64 and 66 of the clamp body 62.

A variety of other gas flow provisions can be made within the separately pressurizable region 74. For example, the direction of flow through the periphery of the heat-transfer interface 76 can be reversed by exchanging the functions of the inlet and outlet conduits 78 and 80. The location, size, and number of the inlet and outlet conduits 78 and 80 can be optimized for particular applications. A single conduit could also be used to convey gas both to and from the separately pressurizable region 74.

The peripheral edge surface 56 of the substrate 50 includes a front edge 86 adjacent to the front surface 52 and a back edge 88 adjacent to the back surface 54. The edges 86 and 88 can be sharp or rounded. An actuator (or passive pin set) 90 translates or permits the relative translation of the clamp body 62 with respect to the chuck body 44 along a centerline 92 of the chuck body 44. The relative translation of the clamp body 62 and the chuck body 44 is preferably accomplished by the up/down motion of the chuck or by combined up/down motions of the chuck and the actuator 90.

The inclined seating surface 72 of the clamp body 62 engages the front edge 86 of the substrate 50 in response to this translation and exerts a normal clamping force that includes a first component directed along the centerline 92 for pressing the substrate 50 against the chuck body 44 and a second orthogonally related component directed toward the centerline 92 for centering the substrate on the chuck body 44. Although a wide range of inclination angles of the inclined seating surface 72 (measured with respect to the front surface 52 of the substrate 50) is possible (e.g., between 5° and 85°), inclination angles between 30° and 60° are preferred to provide a good balance between the two components of the edge contact clamping force.

For sealing, clamping, and centering round substrates, the inclined seating surface 72 preferably takes the form of a truncated cone or pyramid; and for similarly engaging square substrates, the inclined seating surface 72 preferably takes the form of a truncated pyramid. Small modifications in the shape of the inclined seating surface 72 can be made to conform with reference features, such as flats or notches, in the peripheral edge surface 56 of the substrate 50. Extended finger portions of the seating surface 72 in engagement with the front surface 52 of the substrate 50 could also be used to seal the notches. The seating surface 72 can also include some curvature in an axial plane of the clamp body 62.

With the substrate 50 removed, the inclined seating surface 72 can be further translated for engaging a mating surface 94 of the temperature-regulated pedestal 46 for self-centering the clamp body 62 on the chuck body 44. The elastomeric O-ring 68 is sized to permit the clamp body 62 to translate along the centerline 92 into engagement with the mating surface 94 of the temperature-regulated pedestal 46.

Figure 4:
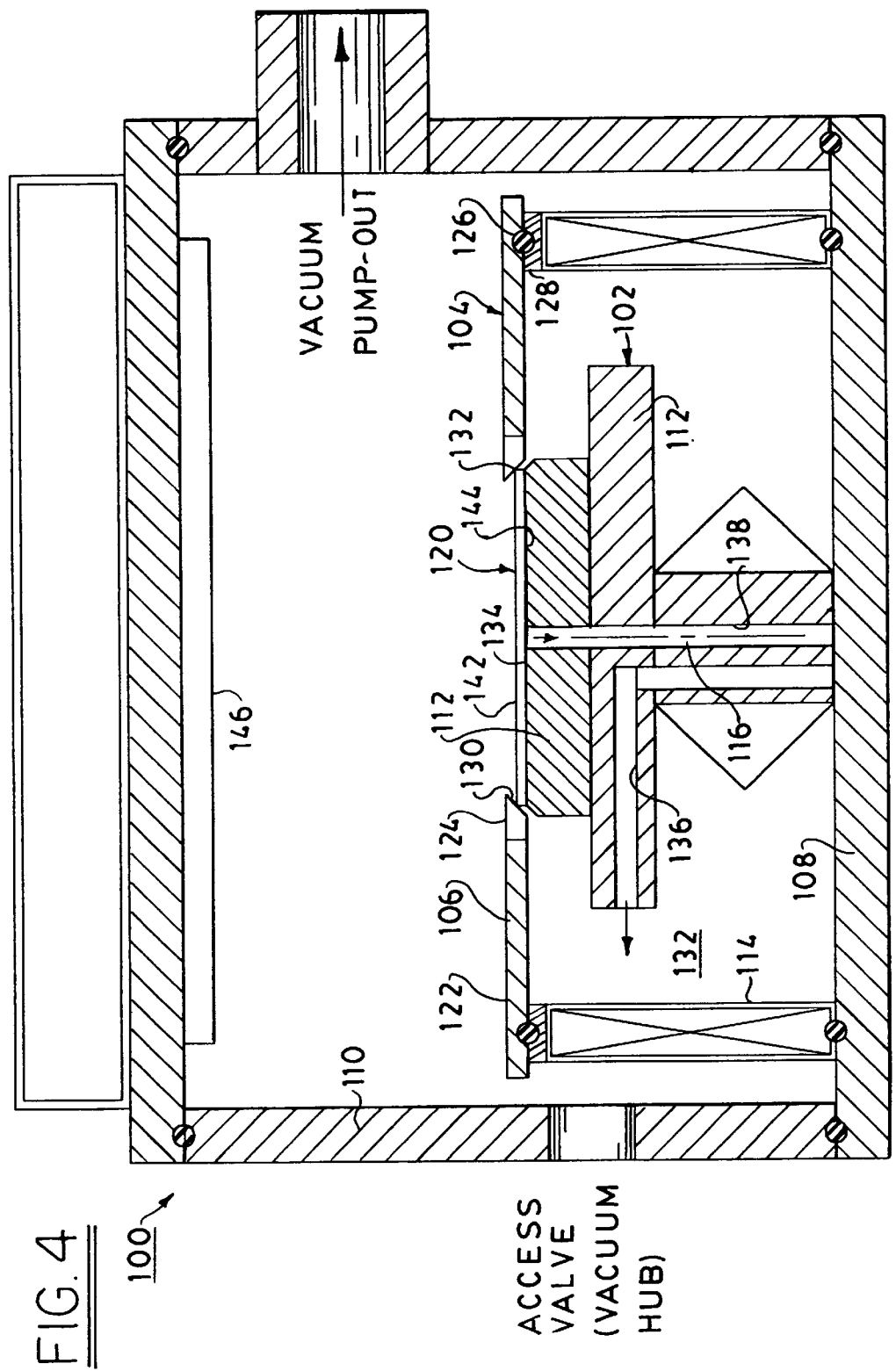
FIG. 4 is a schematic cross-sectional view of a low-pressure processor showing a similar mechanical clamp supported from adjustable height bellows extending from a bottom surface of the low-pressure chamber.

A low-pressure processor 100 depicted in FIG. 4 includes a chuck 102 having a clamp 104 that differs from the clamp of the preceding embodiment by the addition of adjustable-height bellows 114 that support a main body 106 of the clamp 104 from a bottom plate 108 (or any other wall) of a low-pressure processing chamber 110. The adjustable-height bellows 114 also translate the clamp body 106 along a centerline 116 for similarly centering and clamping a substrate 120 on a main body 112 of the chuck 102. The bellows 114 can be replaced with a passive holding and clamping table support, if the chuck up/down actuation mechanism is used to engage or disengage the clamp 106 with the main chuck body 44.

The clamp body 106 includes two sealing regions 122 and 124. An elastomeric O-ring 126 mounted on a support ring 128 atop the bellows (or passive cylinder) 114 engages the sealing region 122 for sealing the clamp body 106 to the bottom plate 108 of the low-pressure processor chamber 110 and indirectly through the bottom plate 108 to the chuck body 112. The sealing region 124 includes an inclined seating surface 130 that engages a front edge 132 of the substrate 120 similar to the preceding embodiment.

The clamp body 106 (including its two sealing regions 122 and 124), the O-ring 126, the support ring 128, the bellows 114, the bottom plate 108, the chuck body 112, and the substrate 120 bound a separately pressurizable region 132 within and isolated from the evacuated space of the processing chamber 110. Within the separately pressurizable region 132 is a heat-transfer interface 134 between the substrate 120 and the chuck body 112, details of which are similar to those of the preceding embodiment. Inlet and outlet conduits 136 and 138 support similar flows of a heat-transfer gas through a periphery of the heat-transfer interface 134. The peripheral edge contact of the inclined seating surface 130 enables exposure of substantially both the entire back surface 144 of the substrate 120 to the heat-transfer gas and the entire front surface 142 of the substrate 120 to processing within the remaining evacuatable space in the processing chamber 110.

However, the sealing region 124 can also be shaped to block unwanted deposits at the interface between the inclined seating surface 130 and the front edge 132 of the substrate 120, such as line-of-sight deposits from a target 146 during PVD operations. This will prevent the sealing region 124 from sticking to the substrate during the PVD process. The sealing region 124 can also be thermally isolated (e.g., cooled or made of a low-thermal-conductivity material) with respect to the substrate 120 to prevent similar unwanted deposits during thermal processing operations such as CVD and MOCVD processes.

Figure 5:
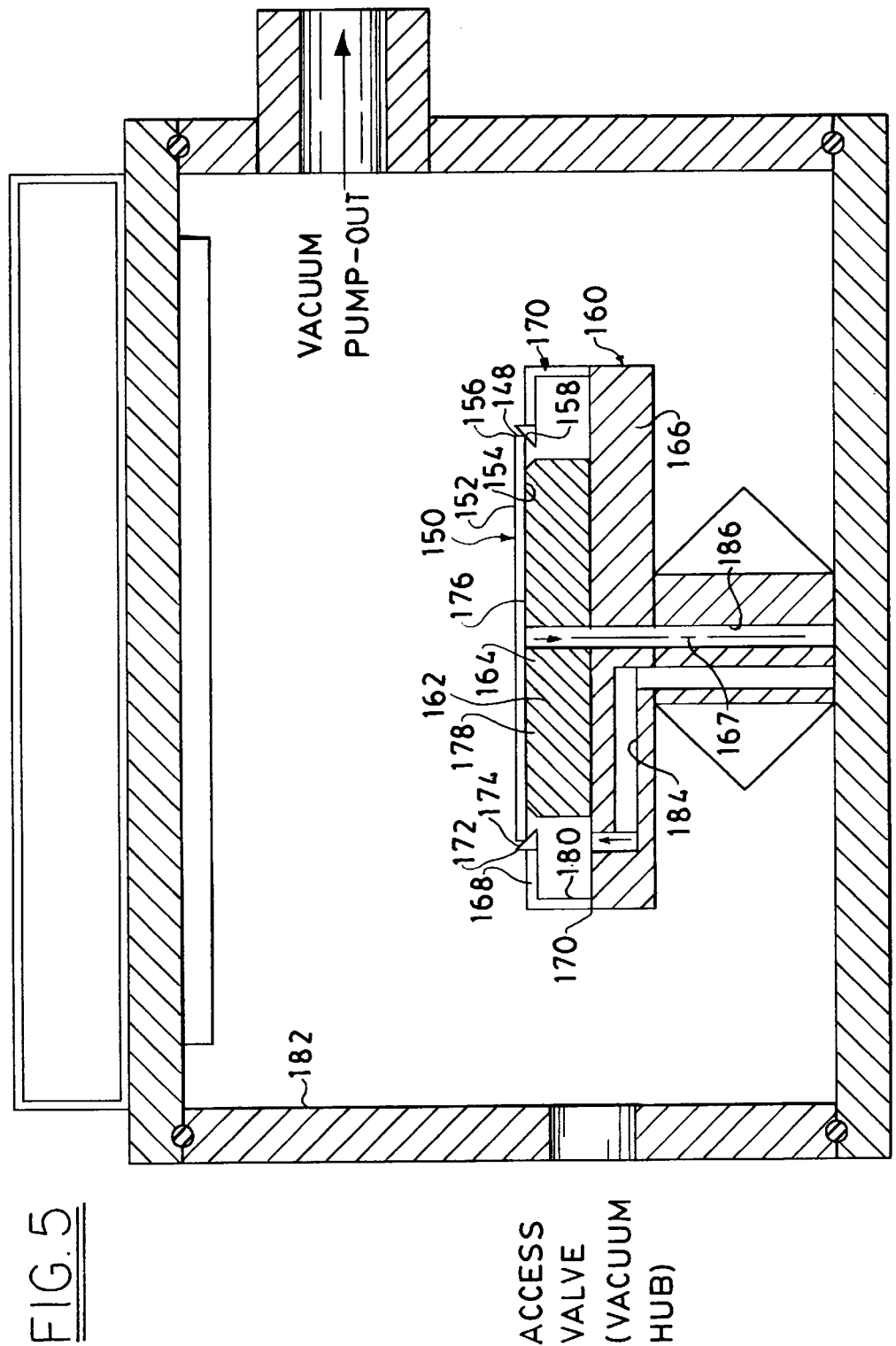
FIG. 5 is another schematic cross-sectional view of a low-pressure processor showing an inclined seating surface engaged with a back edge of the substrate for performing sealing and centering functions.

FIG. 5 depicts an alternative embodiment of the invention in which a peripheral edge surface 148 of a substrate 150 is engaged for purposes of sealing and centering but not for purposes of clamping. The substrate 150 also has front and back surfaces 152 and 154, and the peripheral edge surface 148 includes a front edge 156 adjacent to the front surface 152 and a back edge 158 adjacent to the back surface 154. Again, this design can be used in conjunction with a frontside proximity shadow mask to prevent depositions on the clamp-to-substrate contact interface.

A chuck 160 includes the usual features of a chuck body 162 including a temperature-regulated pedestal 164 and a chuck housing 166 that is translatable along a centerline 167. A sealing structure supported on the chuck housing 166 has a flexible body 168 and two sealing regions 170 and 172. The sealing region 170 can be formed as a permanent connection to the chuck housing 166. The sealing region 172 forms a full peripheral seat having an inclined seating surface 174 for engaging the back edge 158 of the substrate 150.

The substrate 150 is drawn against both the flexibly supported seating surface 174 and a mounting surface 176 of the temperature-regulated pedestal 164 by an electrostatic clamp 178 that is built into the temperature-regulated pedestal 164. The electrostatic clamp 178 is made from layers of patterned electrically conductive and blanket non-conductive materials and is preferably joined to the underlying temperature-regulated pedestal 164 by a bonding or brazing process. Actuating the electrostatic clamp 178 draws the substrate 150 along the centerline 167 first into engagement with the inclined seating surface 174 and second into engagement with the mounting surface 176. The inclined seating surface 174 is shaped for converting a portion of the normal clamping force applied to the substrate into a centering force directed toward the centerline 167. By the time the substrate 150 is secured against the mounting surface 176, the substrate is already centered on and sealed to the chuck body 162. Pins (not shown) embedded in the chuck body can be used to lift the substrate 150 from the mounting surface 176 for removing the substrate 150 from a surrounding processing chamber 182.

The flexible seal body 168 and its two sealing regions 170 and 172, together with the chuck body 162 and the substrate 150, bound a separately pressurizable region 180 within the evacuatable space of the processing chamber 182. Inlet and outlet conduits 184 and 186 convey heat-transfer gas to and from the separately pressurizable region 180. Again, the peripheral sealing engagement of the substrate 150 permits the exposure of substantially both its entire back surface 154 to the heat-transfer gas and its entire front surface 152 to a processing environment (e.g., PVD, CVD, and MOCVD processing). If needed, the sealing region 172 can be shielded (not shown) to prevent unwanted depositions at a sealing interface between the seating surface 174 and the back edge 158 of the substrate 150.

Co-pending U.S. application Ser. No. 08/934,287, entitled "Thermally Conductive Chuck for Vacuum Processor", filed Sep. 19, 1997, discloses other chuck designs with similar separately pressurizable regions that can be adapted to the purposes of this invention and is hereby incorporated by reference. For example, the referenced clamps can be modified to include seating surfaces that engage the peripheral edge surfaces of substrates instead of the substrates' front surfaces.

All of the embodiments illustrated so far support free (or substantially uninhibited) flows of heat-transfer gas through the peripheries of heat-transfer interfaces. The seating surfaces engaging the substrate peripheries provide primary seals for isolating the separately pressurizable spaces from the remaining spaces in the processing chambers. However, the next embodiment includes a two-stage sealing structure that supports similar heat transfers but provides additional protection against the leakage of gas into the processing region of the processing chamber.

Figure 6:
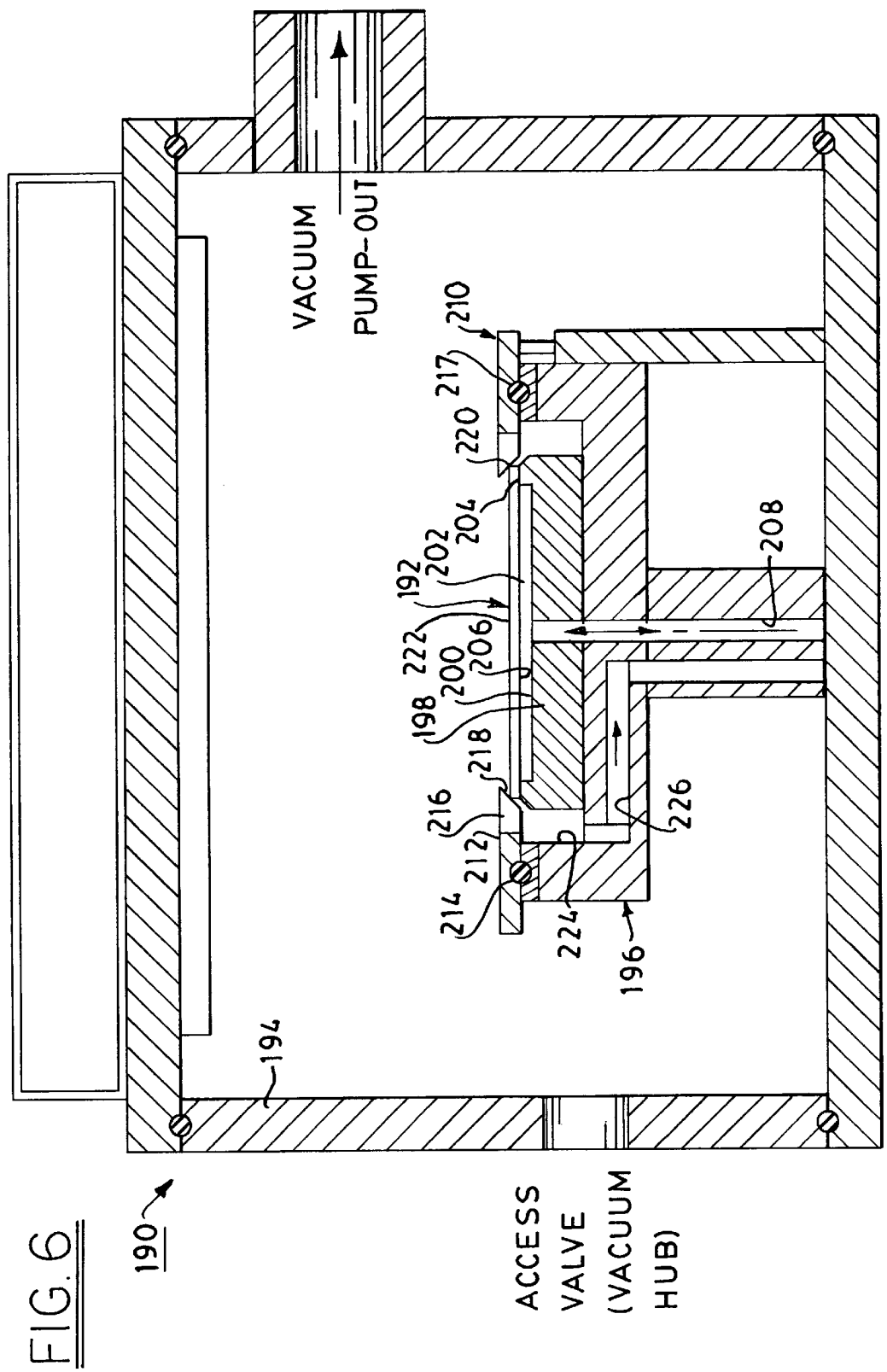
FIG. 6 is a schematic cross-sectional view of a low-pressure processor similar to the low-pressure processor of FIGS. 2 and 3 showing a two-stage sealing arrangement for reducing leakage of heat-transfer gas into the processing region of a processing chamber.
Figure 7:
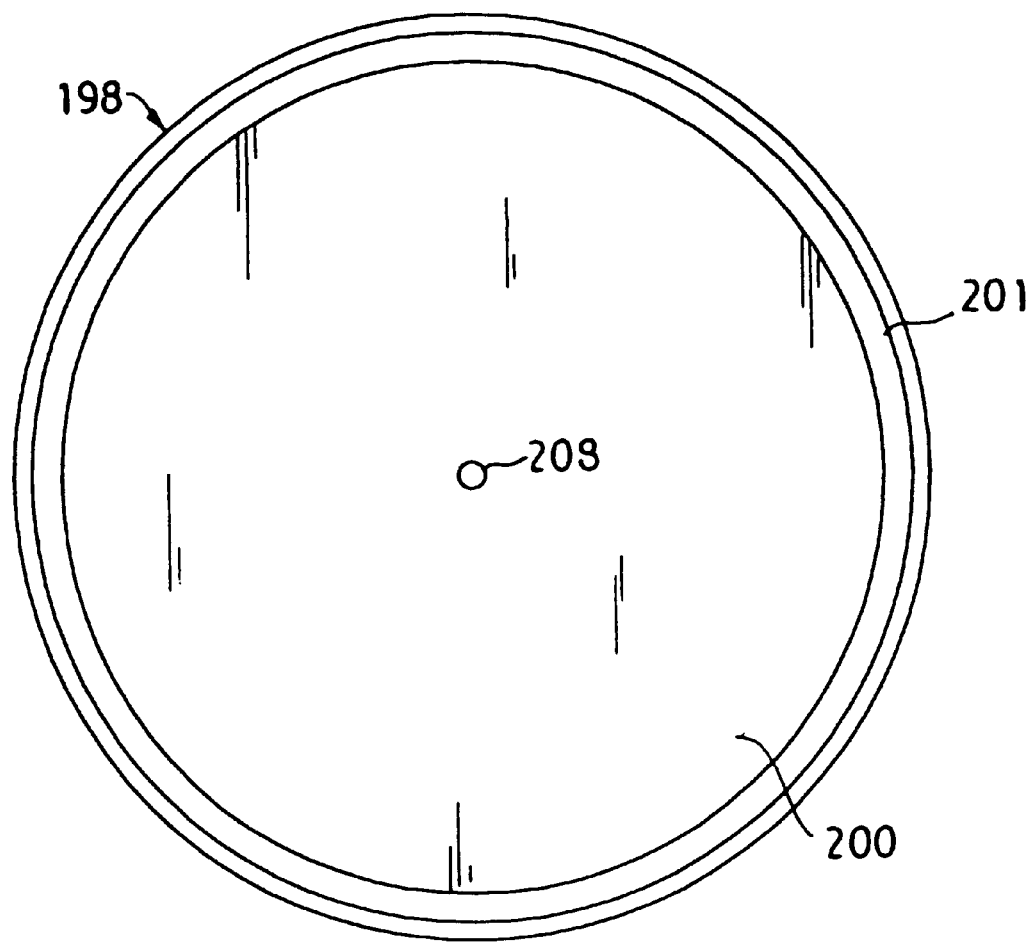
FIG. 7 is a plan view of a mounting surface of the chuck of FIG. 6 showing a raised rim that confines the heat-transfer gas within the heat-transfer interface.

Referring to FIGS. 6 and 7, a low-pressure processor 190 for processing a substrate 192 similar to the low-pressure processor of FIGS. 2 and 3 is shown. Within a low-pressure processing chamber 194, a chuck 196 has a chuck body 198 with a substrate mounting surface 200 that is modified with respect to the mounting surface of FIGS. 2 and 3 to form a first stage (primary) seal surrounding a heat-transfer interface 202 between the chuck body 198 and the substrate 192.

The modification includes a continuous rim 204 that projects from the remaining mounting surface 200 into engagement with a back surface 206 of the substrate 192 at or near the substrate periphery.

The continuous rim 204 also provides a shallow space between the back surface 206 of the substrate 192 and the mounting surface 200 of the chuck body 198 within which a heat-transfer gas can circulate (flow) throughout the heat-transfer interface 202. A single conduit 208 is shown for conveying the heat-transfer gas to and/or from the heat-transfer interface 202, but separate inlet and outlet conduits including concentric inlet and outlet conduits could also be used for supporting continuous flows of the gas.

A clamp 210 similar to the clamp of FIGS. 2 and 3 has a clamp body 212 and two sealing regions 214 and 216. The first sealing region 214 engages an oversized elastomeric O-ring 217 for sealing the clamp body 212 to an extension of the chuck body 198. The second sealing region 216 includes an inclined seating surface 218 that engages a front edge 220 of the substrate 192 for sealing the clamp body 212 to the substrate 192 without blocking a front surface 222 of the substrate 192 from processing.

The two sealing regions 214 and 216 function as portions of a secondary seal between the substrate 192 and the chuck body 198 for further reducing gas leakage from the heat-transfer interface 202 into the processing region of the processing chamber 194. The clamp body 212, the chuck body 198, and the substrate 192 along with the two sealing regions 214 and 216 bound a chamber 224 that surrounds the heat-transfer interface 202. An outlet conduit 226 connected to the chamber 224 evacuates heat-transfer gas leaking from the heat-transfer interface 202, providing a differential pump-out between the heat-transfer interface 202 and the processing region of the low-pressure chamber 194.

Other two-stage sealing systems that can be adapted to the purposes of this invention are disclosed in a co-pending U.S. application Ser. No. 08/938,293, entitled "Two-stage Sealing System for Thermally Conductive Chuck", filed Sep. 26, 1997, which is hereby incorporated by reference. For example, instead of forming the primary seal with a raised rim, uninterrupted portions of the mounting surface of the chuck body and the back surface of the substrate could be brought together into contact to form a comparable seal.

Figure 8:
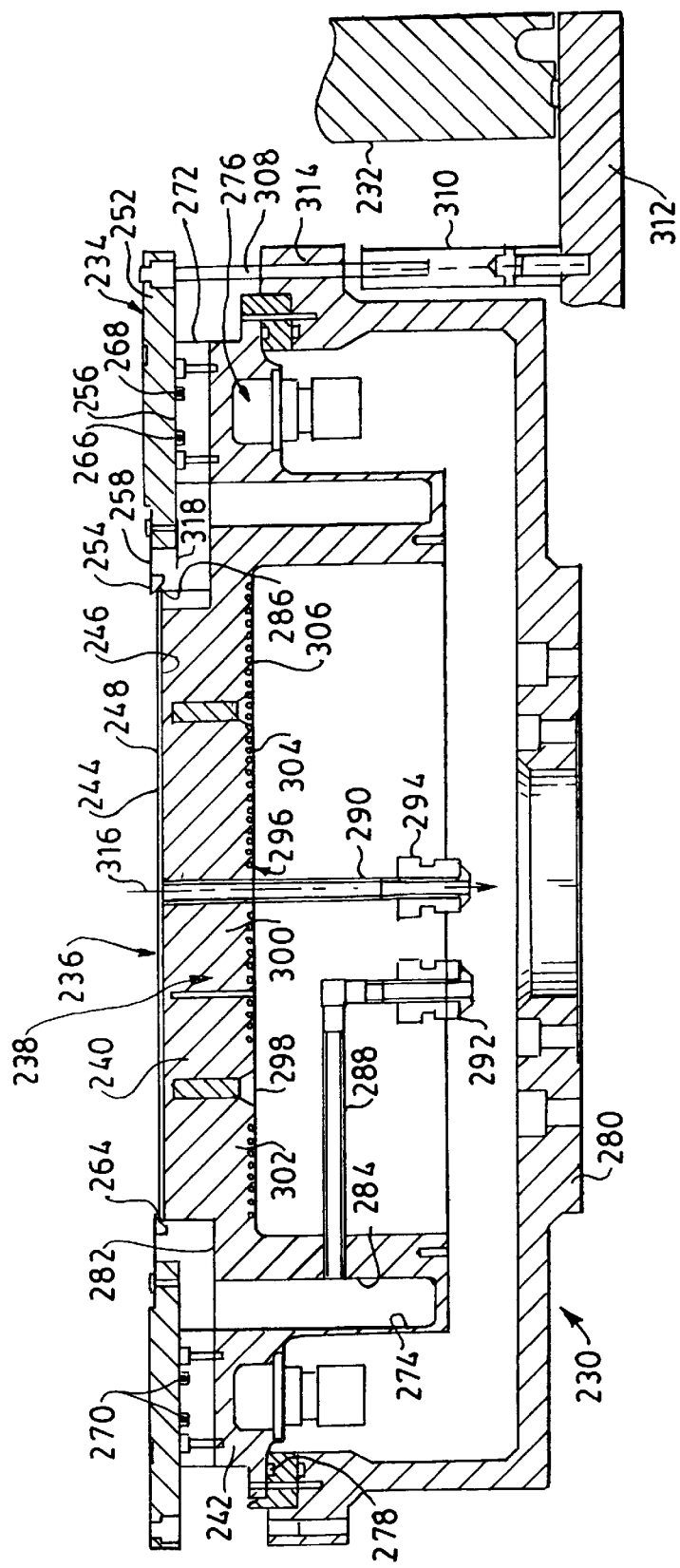
FIG. 8 is a more detailed cross-sectional view of a processing chuck having a mechanical clamp engaged with a front edge of a substrate for clamping, sealing, and centering the substrate on the chuck body.

The remaining drawing figures depict embodiments of this invention in more detail. FIG. 8 depicts a chuck 230 within a cut-away portion of a low-pressure processing chamber 232 having a mechanical clamp 234 for clamping, centering, and sealing a substrate 236 on a chuck body 238. The substrate 236, such as a circular semiconductor wafer, is mounted on a heat-conducting and temperature-regulated portion (pedestal) 240 of the chuck body 238; and the mechanical clamp 234 seals the substrate 236 to a thermally isolated portion 242 of the chuck body 238.

A mounting surface 244 of the chuck body 238 engages and is thermally coupled to a back surface 246 of the substrate 236, forming between them a heat-transfer interface 248. Similar to earlier embodiments, a star-burst pattern of channels 250 (i.e., a combination of radial and circumferential channels) is formed in the mounting surface 244 for circulating or guiding heat-transfer gas (or other fluid) throughout and beyond the interface 248. (The star-burst pattern of channels is not needed when the mounting surface 244 includes a raised peripheral rim of posts to support the wafer.)

Figure 9:
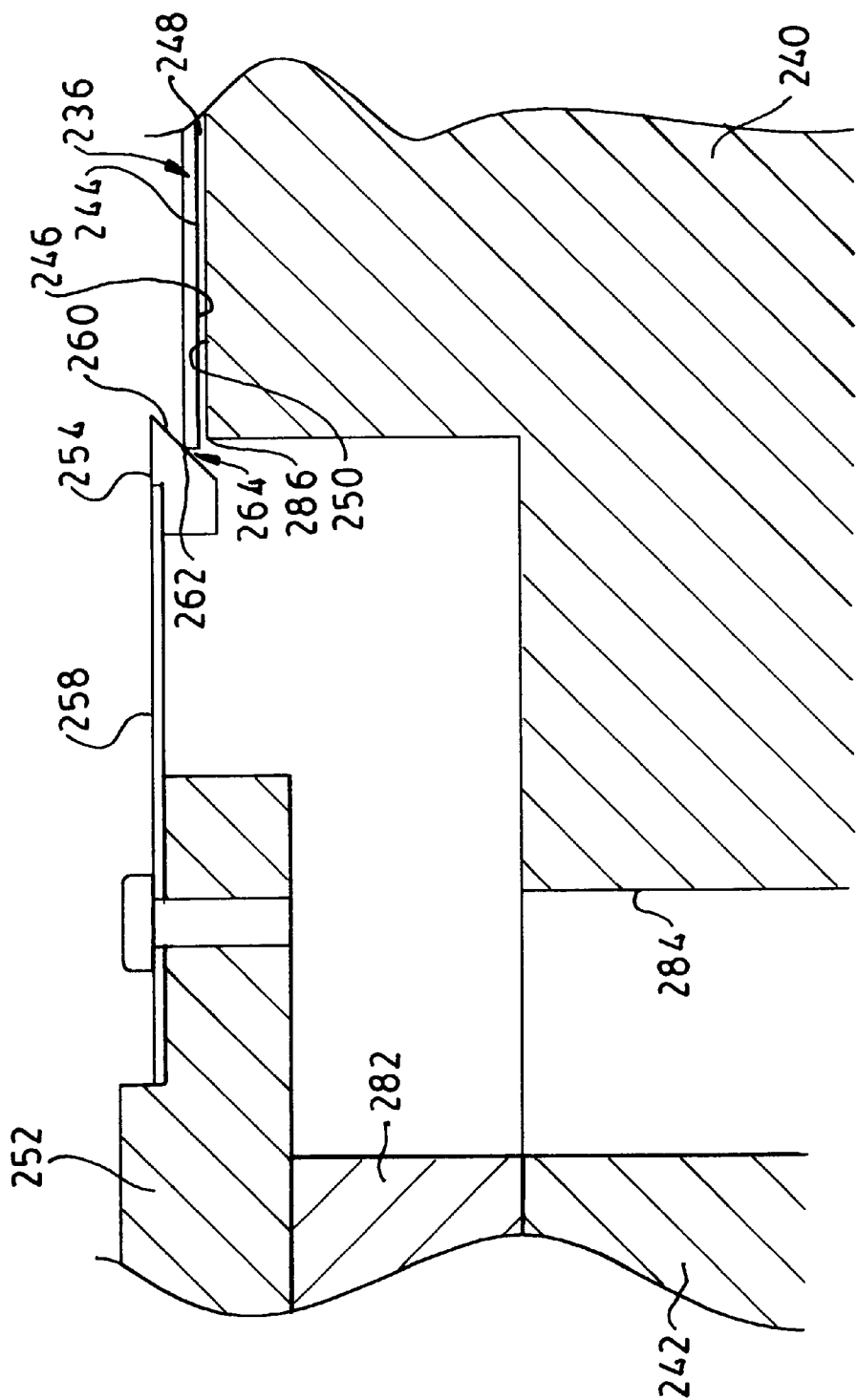
FIG. 9 is an enlarged partial view of FIG. 8 showing a region of engagement between the clamp, the substrate, and the chuck body.

The mechanical clamp 234 includes main body 252 and two sealing portions 254 and 256. The sealing portion 254, which can be seen best in the enlarged broken-away view of FIG. 9, is preferably cantilevered from a flexible annulus 258 of the main body 252 and includes an inclined seating surface 260 that engages a front edge 262 of the substrate 236 forming a first seal 264. The sealing portion 256 engages a pair of O-rings 266 and 268 (or alternatively, only a single elastomer O-ring) forming a second seal 270 with an extension of the chuck body 238. The flexible annulus 258 and the O-rings 266 and 268 provide adjustability for clamping and sealing substrates having a range of different thicknesses. Dimensional tolerances of the chuck 230 and the clamp 234 can also be accommodated. Sometimes, just one of the O-rings 266 and 268 may be needed to provide adequate sealing. On the other hand, the region between the two O-rings 266 and 268 can be differentially pumped out to further reduce leakage into the main processing chamber 232.

The sealing portion 254 can be made of a low-thermal-conductivity material such as a ceramic (aluminum oxide) or a plastic or polymeric material to thermally isolate the clamp body 252 from the substrate 236. A variety of other measures are taken to thermally isolate the O-rings 266 and 268 from the heat-conducting portion 240 of the chuck body 238. For example, an O-ring support ring 272, which can be made of a metallic or ceramic material, supports the O-rings 266 and 268 on the thermally isolated portion 242 of the chuck body 238. A thin-walled trough 274 separates the heat-conducting and temperature-regulated portion 240 from the thermally isolated portion 242 of the chuck body 238. In addition, an annular coolant (or heat-exchanger fluid) channel 276 of a conventional coolant (or heat-exchanger) system (not shown) extends through the thermally isolated portion 242 for extracting unwanted heat before the heat can reach the O-rings 266 and 268. For some applications, such as MOCVD, the temperature of the thermally isolated portion 242 can be controlled (e.g., 50°–70° C.) in order to regulate the temperature of the clamp table 234 and to prevent condensation of the MOCVD reactants and byproducts on the clamp table 234 and the extension (thermally isolated portion) 242 of the chuck 230.

Another annular seal 278, which connects the thermally isolated portion 242 of the chuck body 238 to an axially translatable housing 280 of the chuck body 238, is also protected by the coolant (or heat-exchanger fluid) channel 276 in the thermally isolated portion 242 of the chuck body. Alternatively, the O-ring support ring 272 could be made as an integral part of the thermally isolated portion 242 of the chuck body 238. For hot substrate processing applications (e.g., substrate temperatures in a range of room temperature to less than 550° C.), the temperatures of the clamp 234 and its extension 242 can be regulated to be near the temperature of the coolant or heat exchanger fluid within the channel 276. These temperatures are typically below 100° C. (e.g., 50° to 70° C. in MOCVD copper applications).

The mechanical clamp 234, the two seals 264 and 270, the substrate 236, and the chuck body 238 form an annular chamber 282 that surrounds the heat-transfer interface 248 between the substrate 236 and the chuck body 238. The annular chamber 282 and the heat-transfer interface 248 comprise a separately pressurizable region within the low-pressure chamber 232.

A portion of the annular chamber 282, which is shaped largely by the thin-walled trough 274, functions as an inlet gas manifold 284 for uniformly distributing a heat-transfer gas around a periphery 286 of the heat-transfer interface 248. A single inlet conduit 288 supplies the heat-transfer gas (e.g., argon or helium) to the inlet manifold 284, and a single outlet conduit 290 extends through a center of the mounting surface 244 for exhausting heat-transfer gas from the heat-transfer interface 248. (Although the single outlet conduit 290 is shown in its preferred center position, outlet conduits can extend anywhere through the mounting surface 244 under the substrate 236.) The channels 250 (such as a star-burst channel pattern) formed in the mounting surface 244 extend through the periphery 286 of the heat-transfer interface 248 to permit a tree flow of gas between the heat-transfer interface 248 and the annular chamber 282. Fluid (gas) couplings 292 and 294 connect the inlet and outlet conduits 288 and 290 to flow controls (not shown) similar to the other embodiments.

A direction of flow, which preferably extends from the annular chamber 282 to the heat-transfer interface 248, can be reversed by reversing the functions of the inlet and outlet conduits 288 and 290. The location, size, and number of the inlet and outlet conduits 288 and 290 as well as the channels 250 in the mounting surface 244 can be changed to adjust flow patterns throughout the heat-transfer interface 248. Alternatively, a slotted edge rim or peripheral posts can be used to support the substrate and to allow the free flow of gas at the heat-transfer interface 248.

A multi-zone heater 296 provides further control over temperature variations within the heat-transfer interface 248. The heat-conducting portion 240 of the chuck body 238, which is preferably made of a high-thermal-conductivity material such as aluminum or copper or another suitable metallic material such as stainless steel or another metallic alloy, is interrupted by a zone isolation groove that is filled with an isolation ring 298 made from a low-thermal-conductivity material, such as a suitable ceramic, or is just left as an empty groove for separating the heat-conducting portion 240 into different and separately controllable heating zones 300 and 302. Separately controlled resistive heating coils 304 and 306 regulate temperatures between the different zones 300 and 302 in order to establish a more uniform substrate temperature distribution from center to periphery in order to establish optimal process uniformity. Although depicted with just two zones 300 and 302, the heat-conducting portion 240 of the chuck body 238 could be divided into three or more zones for further controlling the substrate temperature distribution and process uniformity adjustments.

The mechanical clamp 234 is mated to holding pins 308 that are translatable along vertical guides 310 projecting from a bottom wall 312 of the low-pressure chamber 232. The chuck housing 280 also contains vertical guides 314 engaging the same pins 308 for translating the chuck body 238 into engagements with the substrate 236 and the mechanical clamp 234. The vertical guides 310 of the pins 308 permit the chuck body 238, the substrate 236, and the mechanical clamp 234 to translate together along a centerline 316 of the chuck body 238 into a desired processing position within the chamber 232. Ledges 318 extending from a bottom of the mechanical clamp 234 support the substrate 236 above the chuck body 238 for loading and unloading the substrate 236 to and from the processing chamber 232 during substrate handling cycles. Alternatively, pins can be used through the main chuck body to lift the substrate during the substrate handling operations.

Relative movement of the chuck body 238 with respect to the mechanical clamp 234 along the centerline 316 is also used for clamping and centering the substrate 236 on the chuck body 238. The substrate 236 is lifted off of the ledges 318 and into engagement with the sealing portion 254 of the clamp body 252. The inclined seating surface 270 of the sealing portion 254 engages the front edge 262 of the substrate 236 deflecting the flexible annulus 258 from which the sealing portion 254 is supported until the sealing portion 256 of the clamp body 252 also engages the chuck body 238.

The inclined seating surface 260 divides a normal force of the engagement between the seating surface 260 and the front edge 262 of the substrate 236 into a first axial component along the chuck centerline 316 for pressing the substrate 236 against the chuck body 238 and into a second radial component toward the centerline 316 for centering the substrate 236 on the chuck body.

Figure 10:
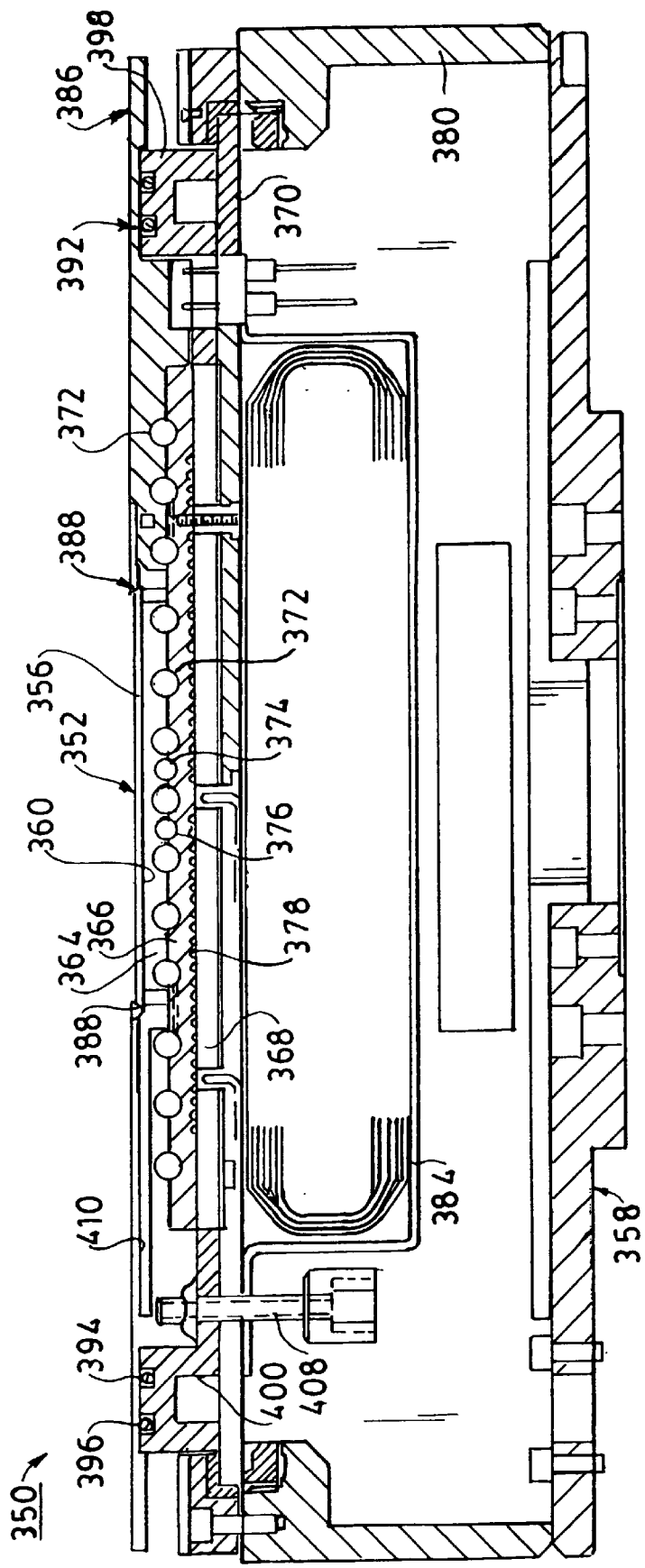
FIG. 10 is another more detailed cross-sectional view of another chuck for magnetic data storage device processing applications having a mechanical clamp engaged with a front edge of a substrate for clamping, sealing, and centering the substrate on the chuck body.
Figure 11:
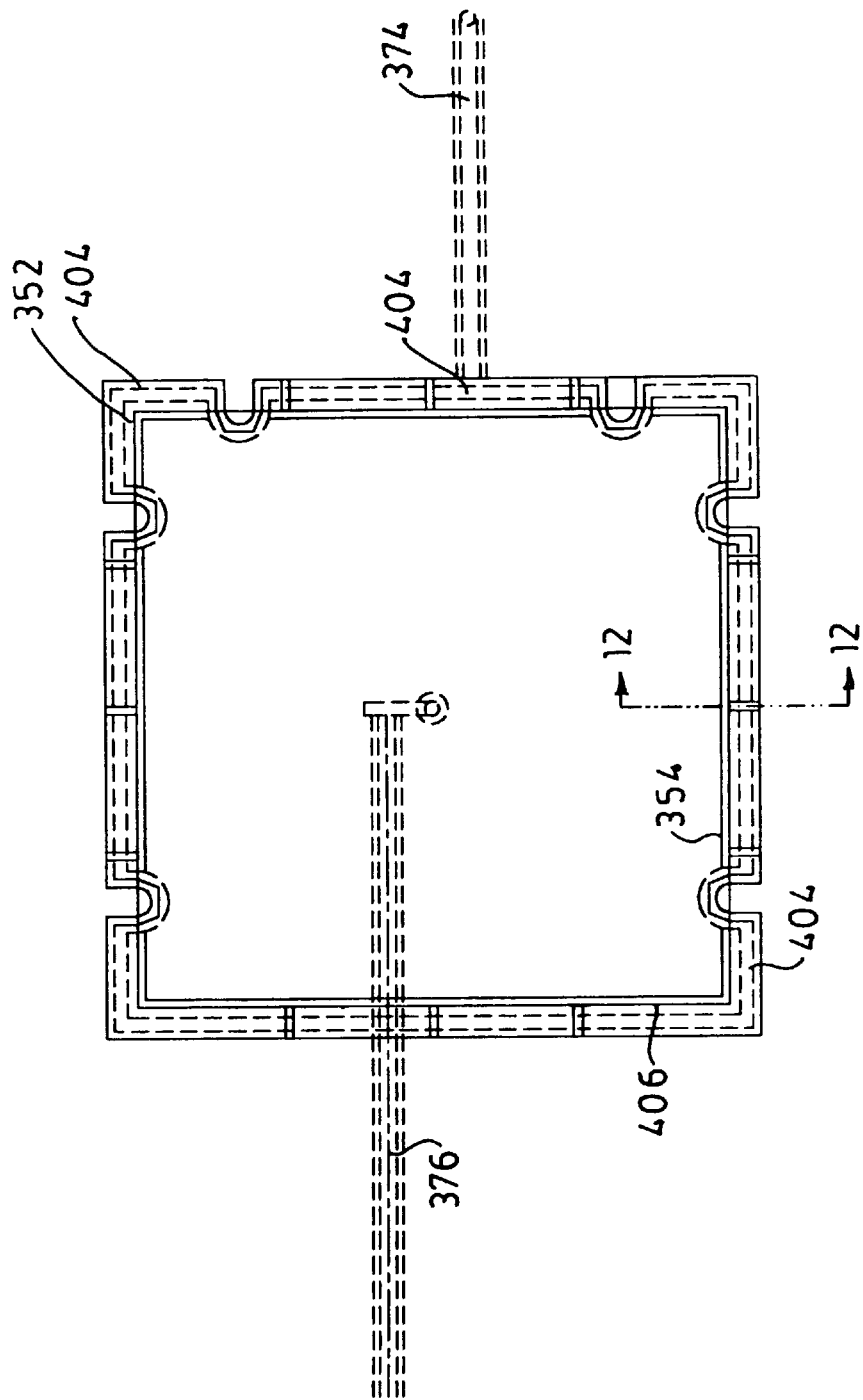
FIG. 11 is a plan view of the chuck of FIG. 10 with the clamp removed to better depict gas passageways in the chuck body.
Figure 12:
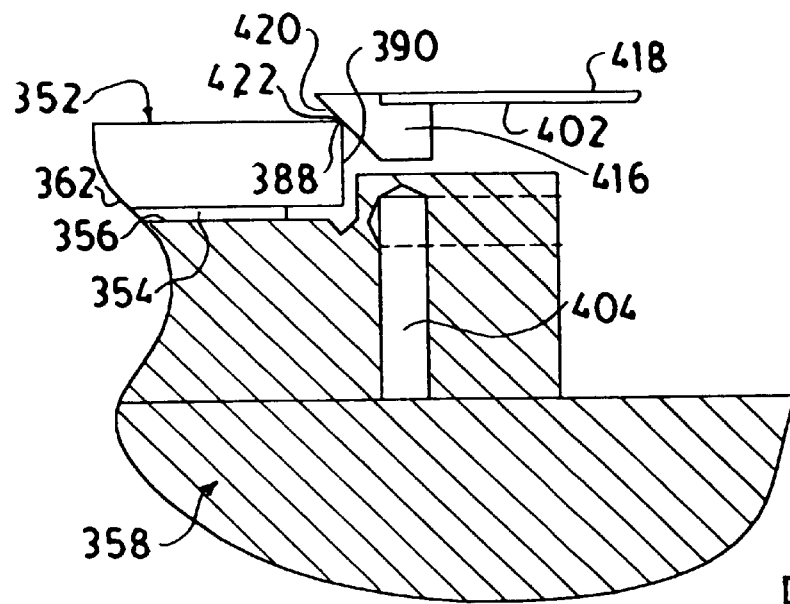
FIG. 12 is an enlarged partial cross-sectional view taken along line 12—12 of FIG. 11 showing a region of engagement between the clamp, the substrate, and the chuck body.

FIGS. 10–12 depict a chuck 350 that embodies yet another of the types of substrate mounting and gas sealing arrangements made possible by this invention. The chuck 350 is particularly suitable for making data storage thin-film heads. A substrate 352 is mounted on a slotted rim 354 (shown in FIGS. 11 and 12) that projects from a mounting surface 356 of a chuck body 358. The slotted rim 354 provides a peripheral support for the substrate 352, and the remaining mounting surface 356 together with a back surface 360 of the substrate 352 forms a heat-transfer interface 362 between the substrate 352 and the chuck body 358.

In place of channels formed in the mounting surface 356, the slotted rim 354 supporting the substrate 352 provides a space between the mounting surface 356 and the back surface 360 of the substrate 352 within which heat-transfer gas can circulate (flow) throughout the heat-transfer interface 362. Spacings between the back surface 360 of the substrate 352 and the mounting surface 356 of the chuck body 358 in a range of 0.05 mm to 0.50 mm are preferred. The slotted rim 354 is preferably formed integral with the chuck body 358 but can also be formed as a separate structure, such as a ceramic ring. Posts or other discontinuous supports can be used for mounting the substrate 352 in place of the slotted rim 354.

The chuck body 358 includes an assembly of plates 364–370. Heat-conducting plates 364 and 366, which are preferably made of copper or aluminum, are machined to provide space for conduits 372 that circulate coolant (e.g., air at pressures over approximately 200 kPa, 30 psi) throughout the chuck body 358 as well as for inlet and outlet conduits 374 and 376 that convey a heat-transfer gas (fluid) to and from the heat-transfer interface 362. The heat-conducting plate 366 also supports a heating unit 378. Insulating plate 368, which is preferably made of ceramic, thermally isolates cooled plate 370 from the heating unit 378. The cooled plate 370 is sealed to a surrounding chuck housing 380 that is translatable within a low-pressure processing chamber (not shown). An electromagnet 384, which is used for magnetic orientation of magnetic thin films, is encased within the chuck housing 380 to prevent out-gassing into the processing chamber.

A mechanical clamp 386, which is also machined to accommodate some of the coolant conduits 372, forms a first seal 388 with a peripheral edge surface 390 of the substrate 352 and a second seal 392 with an extension of the chuck body 358. The second seal 392 includes a pair of compliant O-rings 394 and 396 mounted on an O-ring support ring 398 that is attached to the cooled plate 370. (A single O-ring can sometimes be used instead of the pair of O-rings 394 and 396 as shown.) A coolant (or heat-exchanger fluid) channel 400 formed between the O-ring support ring 398 and the cooled plate 370 further protects the O-rings 394 and 396 from overheating. The coolant conduits 372 that are partly encased by the mechanical clamp 386 can be independently controlled to also prevent heat from reaching the O-rings 394 and 396 through the mechanical clamp 386. However, the main purpose of the coolant conduits 372 is to provide a rapid substrate cool-down capability using a flow of pressurized air.

The mechanical clamp 386 and its two seals 388 and 392 with the substrate 352 and the chuck body 358 confine a space 402 surrounding the heat-transfer interface. Within the space 402 is an inlet manifold 404 (shown in FIGS. 11 and 12) that is formed in the heat-conducting plate 364 of the chuck body 358. The inlet conduit 374 conveys heat-transfer gas directly into the inlet manifold 404, which circulates (flows) the gas around an entire periphery 406 of the heat-transfer interface 362. The outlet conduit 376 exhausts the heat-transfer gas directly from the heat-transfer interface 362. The slotted rim 354 permits a free flow (exchange) of gas between the inlet manifold 404 and the heat-transfer interface 362 to complete a path of circulation (gas flow) from the inlet conduit 374 to the outlet conduit 376. Of course, the direction of flow can easily be reversed by exchanging the functions of the inlet and outlet conduits 374 and 376.

FIG. 10 also shows an alternative inlet conduit 408 that includes a passageway 410 through the mechanical clamp 386 to the inlet manifold 404. Also, a fluid conduit (not shown) between the two O-rings 394 and 396 can be used as a differential pump-out to remove any gas that may have leaked past the innermost O-ring 394 to minimize leakage of gas into the processing chamber.

The enlarged view of FIG. 12 shows a seat portion 416 of the seal 388 cantilevered from a flexible body portion 418 of the mechanical clamp 386. The seat portion 416 includes an inclined seating surface 420 that engages a top edge 422 of the substrate's peripheral edge surface 390, dividing a normal clamping force into a first component that presses the substrate 352 against the mounting surface 356 and a second component that centers the substrate 352 on the mounting surface 356. Although not shown, the chuck body 358 can be modified to include a mating surface that could also be engaged by the inclined seating surface 420 for centering the clamp 386 on the chuck body 358.

Figure 13:
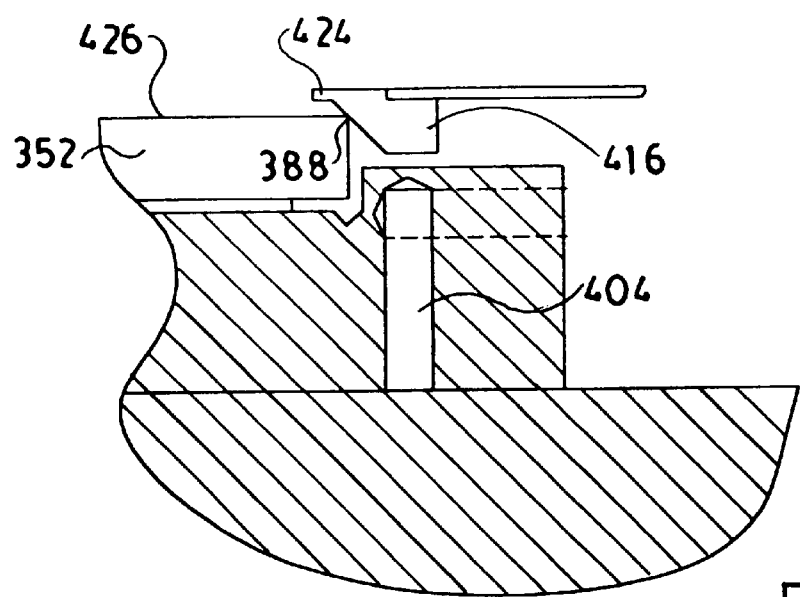
FIG. 13 is a similarly enlarged partial view of the same region illustrated in FIG. 12 showing a modification to the clamp for shielding a seal between the clamp and substrate.

The mechanical clamp 386 is modified in FIG. 13 to include a shield 424 extending from the seat portion 416 for blocking unwanted deposits at the seal 388 between the inclined seating surface 420 and the top edge 422 of the substrate 352. The shape and size of the shield 424 can be adjusted to block line-of-sight exposures of the seal 388, for instance, to a PVD target in the processing chamber. However, the size of the shield 424 is preferably limited so that substantially an entire front surface 426 of the substrate 352 remains exposed for processing and near full-face coverage.

All of the illustrated embodiments have included provisions for sealing substrates directly or indirectly to chuck bodies. However, the illustrated mechanical clamps can be modified to provide only clamping or centering functions without also sealing the substrates to the chuck bodies. For example, one or more interruptions in the inclined seating surface could be used to negate the sealing function.

We claim:

1. A chuck for low-pressure processing equipment comprising:
   a chuck body that supports a substrate for processing within an evacuatable space of a low-pressure processing chamber;
   the substrate having a front surface, a back surface, and a peripheral edge surface interconnecting the front and back surfaces; and
   a sealing structure that engages a portion of the peripheral edge surface of the substrate and that forms together with the substrate and said chuck body a separately pressurizable region within the evacuatable space of the low-pressure processing chamber.

2. The chuck of claim 1 in which said chuck body includes a mounting surface that together with the back surface of the substrate forms a heat-transfer interface.

3. The chuck of claim 2 in which said separately pressurizable region has a gas pressure in the range of 1 Torr and 20 Torr in order to facilitate heat transfer between the substrate and said chuck body.

4. The chuck of claim 2 in which said heat-transfer interface is in fluid communication with a gas outlet and pump-out part connected to said mounting surface.

5. The chuck of claim 2 in which said heat-transfer interface is in fluid communication with a gas inlet port connected to said mounting surface.

6. The chuck of claim 2 in which said heat-transfer interface comprises a gap in the range of 0 to less than 0.5 mm between the back surface of the substrate and said mounting surface.

7. The chuck of claim 2 in which said substrate is supported on said chuck body by a slotted rim structure integral to said mounting surface and in contact with a peripheral region of said substrate back surface.

8. The chuck of claim 2 in which said mounting surface includes a plurality of surface channels to guide a fluid flow at said heat-transfer interface.

9. The chuck of claim 2 in which said substrate is supported on said chuck body by a plurality of posts integral to said mounting surface and in contact with said substrate back surface.

10. The chuck of claim 2 in which said heat-transfer interface comprises a first part of the separately pressurizable region, and a second part of the separately pressurizable region surrounds the first part of the separately pressurizable region.

11. The chuck of claim 10 in which said separately pressurizable region supports a flow of fluid between the first and second parts of the separately pressurizable region and within said heat-transfer interface.

12. The chuck of claim 11 in which the flow of fluid is from the second part of the separately pressurizable region towards said heat-transfer interface.

13. The chuck of claim 10 further comprising a control system that directs a flow of fluid into the separately pressurizable region.

14. The chuck of claim 13 in which said control system controls a flow rate of the fluid through said separately pressurizable region.

15. The chuck of claim 13 in which said control system controls a pressure of the fluid within said separately pressurizable region.

16. The chuck of claim 13 in which said control system supports a flow of fluid between the first and second parts of the separately pressurizable region.

17. The chuck of claim 13 further comprising a seal between the first and second parts of the separately pressurizable region.

18. The chuck of claim 17 in which said control system also directs a flow of fluid from the second part of the separately pressurizable region to reduce leakage of fluid from the first part of the separately pressurizable space into a processing region of evacuatable space in order to reduce disturbance of a fabrication process on the front surface of the substrate.

19. The chuck of claim 1 in which a first seal connects said sealing structure to the portion of the peripheral edge surface of the substrate, and a second seal connects said sealing structure at least indirectly to said chuck body.

20. The chuck of claim 19 in which said second seal connects said sealing structure to an extension of said chuck body.

21. The chuck of claim 19 in which said second seal connects said sealing structure to a portion of the low-pressure processing chamber.

22. The chuck of claim 19 in which said first and second seals are sealed by the weight of a clamping device distributed between the first and second seals.

23. The chuck of claim 19 in which said sealing structure is connected to said chuck body through a portion of the low-pressure chamber.

24. The chuck of claim 19 in which at least one of said first and second seals includes a sealing surface mounted from a flexible portion of the sealing structure.

25. The chuck of claim 19 in which said second seal includes a flexible portion mounted on a portion of said chuck body.

26. The chuck of claim 25 in which said flexible portion comprises an elastomer O-ring.

27. The chuck of claim 25 in which said flexible portion comprises two closely spaced elastomer O-rings with the space between them differentially pumped out.

28. The chuck of claim 19 in which one of said second seal includes a flexible portion mounted from a portion of a wall of the low-pressure processing chamber.

29. The chuck of claim 19 in which said sealing structure is a mechanical clamp that presses the substrate against a mounting surface of the chuck body.

30. The chuck of claim 29 in which said first seal includes a seat formed in the mechanical clamp for engaging the portion of the peripheral edge surface of the substrate.

31. The chuck of claim 30 in which said seat is made of a relatively low-thermal-conductivity material to resist transfers of heat between the substrate and said mechanical clamp and to reduce disturbance of substrate-temperature uniformity by said seat.

32. The chuck of claim 31 in which said low-thermal-conductivity material is a suitable material selected from a range of materials that includes ceramic and polymeric materials.

33. The chuck of claim 30 in which said chuck body includes a pedestal for supporting the substrate, and said pedestal includes a mating surface for engaging said seat of the mechanical clamp for centering the mechanical clamp on the chuck body.

34. The chuck of claim 33 in which said pedestal provides for supporting the back surface of the substrate.

35. The chuck of claim 19 in which an extended portion of said sealing structure overhangs a peripheral portion of the front surface of the substrate to prevent deposition of processing material at a contact interface between said first seal and the peripheral surface of the substrate.

36. The chuck of claim 35 in which said extended portion substantially blocks line-of-sight deposition from a physical-vapor deposition target in the processing chamber to the second seal.

37. The chuck of claim 1 in which the peripheral edge surface of the substrate includes a front edge adjacent to the front surface of the substrate and a back edge adjacent to the back surface of the substrate.

38. The chuck of claim 37 in which said sealing structure includes a seat that engages at least a portion of the front edge of the peripheral edge surface for pressing the substrate towards the chuck body.

39. The chuck of claim 38 in which said sealing structure also functions as a mechanical clamp for pressing the substrate against the chuck body.

40. The chuck of claim 39 further comprising an electrostatic clamp on said chuck body, and said sealing structure provides for augmenting a clamping function of said electrostatic clamp.

41. The chuck of claim 37 in which said sealing structure includes a seat that engages the back edge of the peripheral edge surface, and a separate clamp presses the substrate against the seat.

42. The chuck of claim 41 in which said separate clamp is an electrostatic clamp formed on the chuck body.

43. The chuck of claim 1 in which the low-pressure processing chamber is arranged for physical-vapor deposition processes.

44. The chuck of claim 1 in which the low-pressure processing chamber is arranged for chemical-vapor deposition processes.

45. The chuck of claim 44 in which the temperature of at least a portion of said sealing structure is regulated in order to prevent condensation of reactants and byproducts and to suppress material deposition on said sealing structure in chemical vapor deposition applications.

46. The chuck of claim 45 in which the temperature of at least a portion of said sealing structure is regulated by heat transfer between a temperature-regulated extension of said chuck body and said sealing structure.

47. The chuck of claim 46 in which an extension of the chuck body includes a fluid channel for temperature regulation.

48. The chuck of claim 1 in which the low-pressure processing chamber is arranged for metal-organic chemical-vapor deposition processes.

49. The chuck of claim 1 in which the low-pressure processing chamber is arranged for thermal processing applications.

50. The chuck of claim 1 in which said sealing structure prevents material depositions of the back surface of the substrate.

51. The chuck of claim 1 in which said sealing structure enables full-face-coverage material deposition on substantially the entire front surface of the substrate.

52. The chuck of claim 1 in which said sealing structure prevents material deposition on a substantial portion of the peripheral edge surface of the substrate.

53. A clamp for securing a substrate to a chuck body within a low-pressure processing chamber, the substrate having a front surface, a back surface, and a peripheral edge surface interconnecting the front and back surfaces, and the peripheral edge surface including a front edge adjacent to the front surface of the substrate and a back edge adjacent to the back surface of the substrate, said clamp comprising:

a clamp body that is relatively translatable with respect to the chuck body along an axial centerline of the chuck body;

an inner engaging region having an inclined seating surface that contacts the front edge of the peripheral edge surface for guiding the substrate into a desired position on the chuck body in response to the relative movement between the clamp and chuck bodies along the axial centerline of the chuck body;

said inner engaging region forming a full peripheral seal for engaging an entire periphery of the front edge of the substrate; and said clamp body forming a portion of another full peripheral seal for forming together with the chuck body and the substrate a separately pressurizable region within the low-pressure processing chamber.

54. The clamp of claim 53 in which said inclined seating surface of the inner engaging region is arranged for generating a clamping force between the inner engaging region and the front edge of the substrate having a first component directed along the chuck body axial centerline for pressing the substrate against the chuck body and a second in-plane component directed toward the centerline for guiding the substrate into the desired aligned and centered position on the chuck body.

55. The clamp of claim 54 in which said inclined seating surface is inclined to the front surface of the substrate through an angle between 30 degrees and 60 degrees.

56. The clamp of claim 54 further comprising an actuator for relatively translating said clamp body with respect to the chuck body along the chuck body axial centerline and for generating the clamping force between said inner engaging region of the clamp and the front edge of the substrate.

57. The clamp of claim 53 in which said inclined seating surface is arranged for engaging a mating surface on the chuck body for centering and alignment of said clamp body on the chuck body.

58. The clamp of claim 53 in which said inner engaging region is shaped to expose substantially the entire front surface of the substrate for processing within the low-pressure processing chamber.

59. The clamp of claim 58 in which said inner engaging region includes an extended portion that overhangs a portion of the front surface of the substrate to prevent unwanted deposition of processing material at an interface between said inclined seating surface and the front edge of the substrate.

60. The clamp of claim 58 in which said inner engaging region is made of a low-thermal-conductivity material selected from a group of suitable materials that include ceramic and polymeric materials.

61. The clamp of claim 58 in which said inner engaging region is supported from a flexible portion of said clamp body.

62. The clamp of claim 53 in which said separately pressurizable region is also formed by an extension of the chuck body.

63. The clamp of claim 53 in which said separately pressurizable region is also formed by a portion of a wall of the low-pressure processing chamber.

64. A combination clamp and seal for a substrate mounted on a chuck body in a low-pressure processing chamber, the substrate having a front surface, a back surface, and a peripheral edge surface interconnecting the front and back surfaces, and the peripheral edge surface including a front edge adjacent to the front surface of the substrate and a back edge adjacent to the back surface of the substrate, said combination comprising:

a clamp body that is relatively movable with respect to the chuck body;

a full peripheral seating surface that engages the front edge of the substrate in response to the relative movement between the clamp and chuck bodies for both pressing the substrate against the chuck body and sealing said clamp body to the substrate;

said full peripheral seating surface being a first of two engagement regions of said clamp body, said first engagement region forming a portion of a first seal for connecting said clamp body to the substrate and a second of said engagement regions forming a portion of a second seal for connecting said clamp body at least indirectly to the chuck body; and said clamp body together with said first and second seals, the chuck body, and the substrate bounding a separately pressurizable space within the low-pressure processing chamber.

65. The combination of claim 64 in which said separately pressurizable space is further bound by an extension of the chuck body.

66. The combination of claim 64 in which said separately pressurizable space is further bound by a portion of a wall of the low-pressure processing chamber.

67. The combination of claim 64 in which said full peripheral seating surface is an inclined surface that contacts the front edge of the substrate for guiding the substrate into a desired position on the chuck body in response to the relative movement between the clamp and chuck bodies.

68. The combination of claim 64 in which said full peripheral seating surface has the shape of a truncated cone for circular substrates.

69. The combination of claim 64 in which said full peripheral seating surface has the shape of a truncated pyramid for square substrates.

70. The combination of claim 64 in which said full peripheral seating surface is shaped to expose substantially the entire front surface of the substrate for processing within the low-pressure processing chamber.

* * * * *